United States Patent

Xi et al.

[11] Patent Number: 6,127,619
[45] Date of Patent: Oct. 3, 2000

[54] PROCESS FOR PRODUCING HIGH PERFORMANCE THERMOELECTRIC MODULES

[75] Inventors: Xiaomei Xi, Carlsbad; Goran S. Matijasevic, San Clemente; Lutz Brandt; Linh Ha, both of Carlsbad, all of Calif.

[73] Assignee: Ormet Corporation, Carlsbad, Calif.

[21] Appl. No.: 09/093,966

[22] Filed: Jun. 8, 1998

[51] Int. Cl.[7] .............................. H01L 35/28; H01L 35/34
[52] U.S. Cl. ........................... 136/203; 136/201; 136/205
[58] Field of Search .................................. 136/200, 201, 136/203, 205

[56] References Cited

U.S. PATENT DOCUMENTS

| | | | |
|---|---|---|---|
| 2,951,105 | 8/1960 | Busanovich | 136/5 |
| 4,855,810 | 8/1989 | Gelb et al. | 357/87 |
| 4,902,648 | 2/1990 | Ohta et al. | 437/247 |
| 5,064,476 | 11/1991 | Recine, Sr. | 136/201 |
| 5,108,515 | 4/1992 | Ohta et al. | 136/201 |
| 5,246,504 | 9/1993 | Ohta et al. | 136/201 |
| 5,318,743 | 6/1994 | Tokiai et al. | 419/38 |
| 5,430,322 | 7/1995 | Koyanagi et al. | 136/203 |
| 5,507,879 | 4/1996 | Gyoten et al. | 136/224 |
| 5,610,366 | 3/1997 | Fleurial et al. | 136/202 |

OTHER PUBLICATIONS

T. Kajikawa and T. Ohta, "Chalocogenides based thick film thermoelectric elements for power generation module", *The First European Conference on Thermoelectrics* Chapter 29:P331–341 (1989), no month given.

*Primary Examiner*—Kathryn Gorgos
*Assistant Examiner*—Thomas H Parsons
*Attorney, Agent, or Firm*—Gray Cary Ware & Freidenrich LLP; Stephen E. Reiter; Ramsey R. Stewart

[57] ABSTRACT

A method for cost-effectively producing thermoelectric elements and thermoelectric modules with a multitude of thermoelectric couples is disclosed. This method makes the fabrication of very small size thermoelectric elements and miniaturized, compact, powerful thermoelectric modules possible. Methods of the present invention can be also used to fabricate integrated thermoelectric modules in electrical or other devices. The invented method is based on an additive technology using thermoelectric pastes and a patternable insulator layer. Layers of conductive traces are first fabricated on the two insulating planes. A patternable insulator layer is formed and filled with P- and N-type thermoelectric pastes. The thermoelectric elements are formed during the curing or sintering of the thermoelectric pastes. Sizes and positions of the thermoelectric elements are defined by the patterned insulator layer. Thermoelectric modules are obtained by electrically connecting the P- and N-type thermoelectric elements through the electrical conductive traces on the two insulating planes.

18 Claims, 7 Drawing Sheets

PROCESS FOR PRODUCING HIGH PERFORMANCE THERMOELECTRIC MODULES

FIELD OF THE INVENTION

The present invention relates to methods for producing thermoelectric modules. One aspect of the invention relates to methods for producing thermoelectric modules with a multitude of thermoelectric couples.

BACKGROUND OF THE INVENTION

Thermoelectric modules are based on the Peltier effect, which states that a DC current applied across two dissimilar materials causes a temperature differential. A typical thermoelectric module comprises two ceramic wafers with a series of P- and N-doped thermoelectric elements sandwiched between them. One P- and one N-type thermoelectric element make up a thermoelectric couple. Thermoelectric couples are connected electrically in series and thermally in parallel. A thermoelectric module can contain one to several hundred couples. Its performance is proportional to the electrical current and the number of thermoelectric couples. Thermoelectric modules are used in device cooling, power generation, and temperature stabilization.

Conventionally, thermoelectric modules are produced by slicing ingot thermoelectric material into bulk thermoelectric elements and bonding them onto electrodes through soldering or like techniques. Ingot thermoelectric materials are produced using high temperature alloying, powder sintering, poly-crystallization zone melting, amorphous production as well as other techniques known to those skilled in the art. However, conventional production of thermoelectric modules involves numerous problems. For example, the process is complicated. High temperature and long processing times are needed to produce ingot thermoelectric materials. Thus the productivity is low and the cost is high. In addition, process automation is difficult since the thermoelectric elements are produced by slicing only one at a time. This too leads to high production costs. Finally, assembly of thermoelectric modules requires placement and attachment of the individual, and sometimes very small, thermoelectric elements.

An additional problem encountered with conventional production of thermoelectric modules is the notably lower yield of thermoelectric elements when the thickness of the thermoelectric elements is less than 1.5 mm. This is due to the difficulty in cutting ingot thermoelectric materials. Miniaturization of thermoelectric elements is very difficult. As a result, the number of thermoelectric couples that can be fabricated in a thermoelectric module is limited. Thus, the efficiency of the thermoelectric modules is rather low. In summary, it is very difficult to produce compact, high performance thermoelectric modules using conventional methods.

Accordingly, new processing methods are thus needed for cost-effectively producing compact thermoelectric modules with a multitude of thermoelectric couples.

OBJECTS OF THE INVENTION

To circumvent the problems associated with conventional processing techniques for producing thermoelectric modules, it is an object of this invention to provide processing methods for cost-effective production of thermoelectric modules with a multitude of thermoelectric couples.

Another object of the invention is to provide processing methods for processing very small size thermoelectric elements.

Still another object of the invention is to provide methods for producing very small, compact thermoelectric modules.

These and other objects of the invention will become apparent upon review of the specification and appended claims.

BRIEF DESCRIPTION OF THE INVENTION

In accordance with the present invention, there are provided methods for the cost-effective production of thermoelectric elements. Invention methods employ composite thermoelectric pastes instead of ingot thermoelectric materials to produce thermoelectric elements. Thermoelectric elements are obtained by depositing the thermoelectric pastes into pattern holes that have been selectively formed in a patternable insulator, followed by curing and/or sintering of the deposited pastes. Location, shape and size of the individual thermoelectric elements are thereby determined by the pattern of the holes.

In accordance with another embodiment of the invention, there are provided methods of forming thermoelectric modules using a variety of related approaches, including an additive process whereby individual circuit trace-containing layers are fabricated followed by the formation thereon of one or more thermoelectric element containing layers; a laminating process whereby individual circuit trace-containing layers and thermoelectric layers are formed and then laminated together to form single or multi-stage thermoelectric modules; and combinations of the two methods.

The advantages and efficiencies of the present invention will become more apparent by referring to the following detailed description of the invention in conjunction with the accompanying drawings.

BRIEF DESCRIPTION OF THE FIGURES

FIGS. 2A, 2B, 2C, 2D, 2E, 2F and 2G diagram a process which exemplifies an embodiment of the invention method for producing thermoelectric elements using thermoelectric pastes.

DETAILED DESCRIPTION OF THE INVENTION

Figure 1:
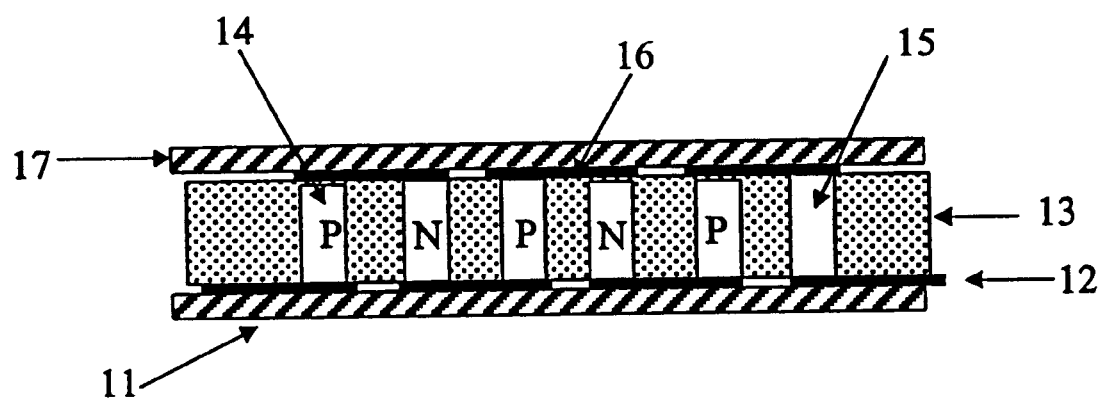
FIG. 1 is a typical example of a thermoelectric module produced using the invention methods.

In accordance with the present invention, there are provided methods for creating thermoelectric elements and precursors thereof, said method comprising:
  A. selectively imparting a pattern to a patternable insulator layer, thereby forming pattern holes therethrough,
  B. selectively depositing P- and N-type thermoelectric pastes into portions of said pattern holes,
  C. optionally, curing and/or sintering said P- and N-type thermoelectric pastes, wherein said pattern holes into which said P-type thermoelectric paste is deposited are not the same as the pattern holes into which said N-type thermoelectric paste has been deposited, such that a layer of thermoelectric elements is formed containing one or more thermoelectric couples.

As will be understood by those of skill in the art, until curing and/or sintering, thermoelectric elements have not been fully formed and are thus considered "precursors."

The patternable insulator layer provides a supporting frame for the deposition of thermoelectric pastes, as described in greater detail below. The patternable insulator layer can be retained in the thermoelectric module as in the case where polymer thick film thermoelectric pastes are used. Alternatively, a removable resist material can be used which, upon curing of the thermoelectric pastes, is dissolved away. The insulator layer can also be burned out during the sintering processing of thermoelectric elements as in the case where ceramic thick film thermoelectric pastes are used to prepare the thermoelectric elements.

As will be readily understood by those skilled in the art, there are a number of patternable insulating materials that can be employed in accordance with the present invention. As used herein, "patternable insulating materials" or "patternable insulator" includes any electrically insulating material which can be patterned. Suitable patterning methods include, but are not limited to, photoimaging and subsequent development, plasma etching, sand blasting, laser drilling, chemical etching, mechanical drilling, or other techniques known in the art.

Suitable materials for patternable insulators include, for example, photopatternable epoxies, epoxy-acrylates, polyimide-based resins, epoxy-based resins, thermoplastics, phenolic-based resins, methacrylates, cyclic hydrocarbons, and the like. These materials can be commercially obtained in liquid or dry sheet/film form. As is readily understood by those of skill in the art, the patternable insulator may be applied to the underlying trace-containing layer to the desired thickness by a number of suitable methods. Such methods include, but are not limited to, laminating (e.g., roll lamination, etc.), and like techniques for dry sheet/film form patternable insulators. Suitable application methods for patternable insulators in liquid form include, but are not limited to, screen printing, curtain coating, stencil printing, doctor blading, spraying, spin coating, roller coating, extrusion, and the like. In a preferred embodiment of the invention, the patternable insulator layer will be from about 5 $\mu$m to about 10 mm in thickness.

As used herein, "thermoelectric paste" comprises N- or P-type thermoelectric materials composed of a polymer thick film thermoelectric paste, or a ceramic thick film thermoelectric paste. In one embodiment of the present invention, polymer thick film thermoelectric pastes comprise a polymer binder, such as, for example, any thermosetting or thermoplastic material compatible with the thermoelectric material, thermoelectric materials or precursors thereof which, upon further processing by invention methods, can form thermoelectric materials, and, optionally, a suitable solvent, such as acetone, alcohols, glycols, and the like. In another embodiment a ceramic thick film thermoelectric paste can be used. Ceramic thick film thermoelectric pastes comprise a mixture of one or more ceramic thermoelectric materials or precursors thereof which, upon further processing by invention methods, can form thermoelectric materials, with a suitable solvent, optionally, an organic binder, including any organic binder with appropriate rheology characteristics and that will decompose (burn out) during curing/sintering without leaving excessive char, and, optionally, glass frit. Suitable ceramic thermoelectric material powders include, for example, $Bi_2Te_3$, PbTe, $Bi_2Se_3$, and the like, Thermoelectric pastes generally must be sintered in order to render them operable as thermoelectric elements. This is achieved by heating the thermoelectric pastes under conditions suitable to cause sintering. The polymer binder is retained in the polymer thick film thermoelectric elements during the low temperature (<300° C.) curing or sintering process, while the polymeric or organic binder in the ceramic thick film thermoelectric pastes is burned out during the high temperature (>500° C.) sintering process. When polymer thick film thermoelectric pastes are applied, the patternable insulator layer usually is retained due to the low curing or sintering temperature of the polymer thick film thermoelectric pastes (<300° C.), although it may also be later removed if a removable resist material is used. When ceramic thick film thermoelectric pastes are used, the patternable insulator layer is usually burned out during the sintering process, because of the high sintering temperature (>500° C.). Thermoelectric elements of the present invention need not, however, be sintered immediately upon manufacture. Rather, the thermoelectric pastes can be sintered by subsequent users or manufacturers incorporating thermoelectric module precursors formed by invention methods. Therefore the sintering reaction is an optional component of invention methods.

The thermoelectric pastes of the present invention are deposited into portions of the pattern holes that have been selectively imparted to the patternable insulator, so that N and P type pastes alternate, thereby creating one or more thermoelectric couples. As is readily understood by those of skill in the art, the thermoelectric paste may be applied to the patternable insulator by a number of suitable methods including, but not limited to, screen printing, pressure filling, doctor blading, automatic dispensing, stencil printing, and the like.

In another embodiment of the present invention, there are provided methods for forming a thermoelectric module, said methods comprising:

A. fabricating conductive traces on a first insulating plane, thereby forming a first trace-containing layer, B. forming on said first trace-containing layer a layer of thermoelectric elements created as described herein, C. optionally:
1. forming an intermediate trace-containing layer by applying conductive traces on first and second sides of an insulating plane,
2. affixing said first side of said intermediate trace-containing layer to said layer of thermoelectric elements,
3. affixing to said second side of said intermediate trace-containing layer a next layer of thermoelectric elements,
4. optionally repeating steps (1)–(3), D. fabricating conductive traces on the layer of thermoelectric elements formed during step (B) or affixed during the last iteration of step (3), if carried out, thereby forming a second layer of conductive traces, E. affixing a second insulating plane to said second layer of conductive traces, thereby forming a second trace-containing layer, wherein said thermoelectric element(s) is electrically connected to said conductive traces on said first, second and any intermediate insulating planes such that a thermoelectric module is formed.

By this method, single, or if optional step C is carried out, multi-stage thermoelectric modules can be formed.

The insulating planes provide mechanical support for the thermoelectric elements and electrically conductive traces. As used herein, "insulating plane" includes, but is not limited to electrically insulating materials such as polymers, including, but not limited to, thermoplastic and thermosetting materials, polymer-based composites, including, for example, fiber-reinforced composites and particle-reinforced composites, insulated metals or metal matrix composites, ceramics, and the like. Suitable fibers for fiber-reinforced materials include, glass, carbon, ceramic, and like fibers. Suitable particles for particle reinforced materials include ceramic particles, glass beads, and like particles. Preferred materials are insulated materials with good thermal conductivity, such as insulated metals or metal composites, ceramics, thermally conductive polymer composites, graphite, diamond, and the like.

The conductive trace-containing layers provide means to electrically connect the thermoelectric elements and thus form a thermoelectric module. As contemplated by the present invention, conductive traces can be formed by a variety of techniques, such as, for example, etching metal laminates, vapor deposition of metals, deposition of conductive pastes, and such other techniques as are known in the art, as well as combinations of such techniques. Suitable metal laminates for etching and/or vapor deposition include, but are not limited to, copper, aluminum, gold, silver, nickel, and the like. Suitable conductive pastes include, but are not limited to, polymer or ceramic thick film pastes, solder pastes, transient liquid phase sintering pastes, and the like. Preferably, the conductive traces are able to form reliable electrically conductive bonds with the thermoelectric elements during the curing or sintering of the thermoelectric pastes.

In yet another embodiment of the present invention, methods are provided for forming thermoelectric modules and precursors thereof, said methods comprising:

A. fabricating conductive traces on a first and a second insulating plane, thereby forming first and second trace-containing layers, B. applying a patternable insulating layer to said first trace-containing layer, C. forming on said patternable insulating layer a layer of thermoelectric elements as described herein, D. optionally,
 1. forming an intermediate trace-containing layer by applying conductive traces on first and second sides of an insulating plane,
 2. affixing a first side of said intermediate trace-containing layer to said layer of thermoelectric elements,
 3. forming on said patternable insulating layer a layer of thermoelectric elements as described herein,
 4. optionally, repeating steps 1–3, E. laminating the second trace-containing layer to said layer of thermoelectric elements, F. optionally, heating said laminate under conditions suitable to sinter the thermoelectric pastes, thereby forming a thermoelectric module.

In still another embodiment of the present invention, methods are provided for forming thermoelectric modules, said methods comprising:

A. fabricating conductive traces on a first and a second insulating plane, thereby forming first and second trace-containing layers, B. forming a layer of thermoelectric elements as described herein, C. optionally,
 1. forming one or more intermediate trace-containing layers by applying conductive traces on first and second sides of an insulating plane,
 2. forming one or more layers of thermoelectric elements as described herein, D. laminating said layer of thermoelectric elements, and any optional trace-containing layers alternating with any optional layers of thermoelectric elements, between said first and second trace-containing layers, E. optionally heating said laminate under conditions suitable to sinter the thermoelectric pastes, thereby forming a thermoelectric module.

As used herein, in the context of forming thermoelectric modules, "laminating" refers to application of sufficient pressure and heat to adhere adjacent layers of the module to one another.

In a further embodiment of the present invention, there are provided articles of manufacture incorporating one or more thermoelectric modules manufactured according to the methods described herein.

According to the process of the present invention, thermoelectric elements with sizes as small as 10 $\mu$m in diameter can be produced. This allows the miniaturization of the thermoelectric modules and the production of compact thermoelectric modules containing large numbers (thousands or tens of thousands) of thermoelectric couples, which has heretofore been impossible. With large numbers of thermoelectric couples in a small thermoelectric module, high performance thermoelectric modules are possible even with thermoelectric materials, whose figure of merit (Z, a measure of thermoelectric efficiency) is not very high In addition, because the thermoelectric elements are produced by deposition of thermoelectric pastes into defined locations using screen printing, pressure filling, doctor blading, automatic dispensing, stencil printing, or like techniques, a large number of thermoelectric elements can be produced in a single operation. The processing cost of the thermoelectric modules is thus substantially reduced as the steps of ingot thermoelectric material processing, cutting of the thermoelectric ingot, and soldering of the thermoelectric elements onto the conductive traces are eliminated. Furthermore, with processes of the invention, automation of thermoelectric module production is possible. This will both reduce the cost and increase the reliability of the products. In addition, if polymer thick film thermoelectric materials are used, low processing temperatures are possible.

Invention methods can be also used to fabricate integrated thermoelectric modules in electrical devices, systems, packagings, etc., by integrating the fabrication of the thermoelectric modules with the fabrication of the electrical devices, systems, packagings, etc. The integrated thermoelectric modules can act as thermoelectric coolers, thermoelectric power generators or temperature stabilizers as desired.

As will be readily understood by those skilled in the art, invention methods can be carried out by various insubstantial modifications of the methods herein described. Such variations are contemplated by the inventors as within the scope of the present invention. FIGS. 1–5 illustrate examples of various embodiments of invention methods and articles produced thereby. The embodiments described below and shown in the figures are merely illustrative and non-limiting.

For example, FIG. 1 shows a thermoelectric element comprising a first insulating plane 11, a layer of conductive traces 12 on the first insulating plane 11, a patternable insulator layer 13, P- and N-type thermoelectric elements, 14 and 15, positioned in the patternable insulator layer 13, a second insulating plane 17, and a layer of conductive traces 16 on the second insulating plane 17. The first and second insulating planes 11 and 17 provide mechanical support for the thermoelectric elements and electrically conductive traces. Thermoelectric elements are formed in the patterned regions by curing or sintering the thermoelectric pastes.

Figure 2A:
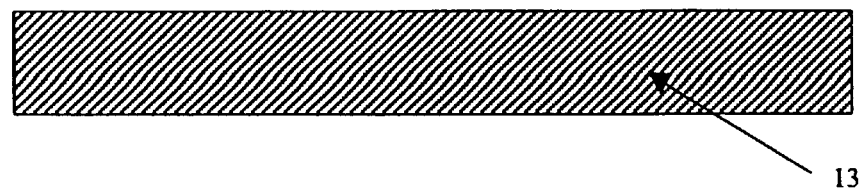
Figure 2B:
Figure 2C:
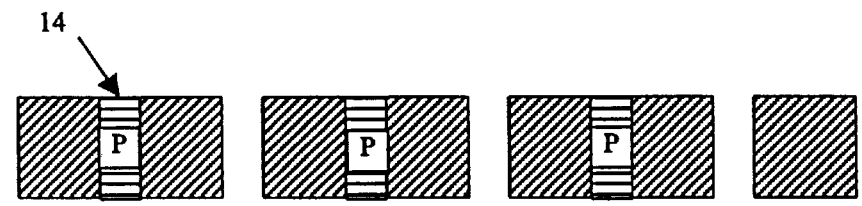
Figure 2D:
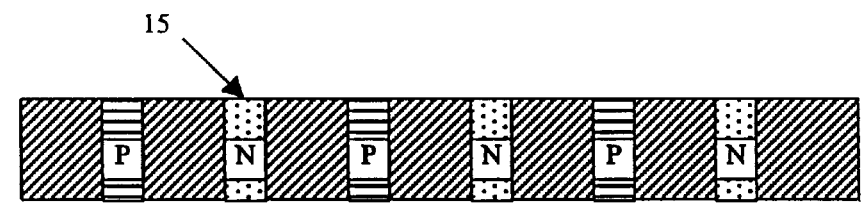

An example of invention methods for fabricating a layer of thermoelectric elements is illustrated in FIGS. 2A through 2D. The process begins with the formation of a patternable insulator layer 13 (FIG. 2A). A desired pattern is fabricated on the patternable insulator layer 13 by one or more methods described herein or other techniques known to the art (FIG. 2B). P- or N-type thermoelectric pastes are then deposited into the patterned holes by one or more methods described herein, or other techniques known to the art, thereby forming P- and N-type thermoelectric elements, 14 and 15 respectively. (FIGS. 2C and 2D). In order to deposit each type of thermoelectric paste individually, the locations for the other thermoelectric paste have to be masked or protected using temporary plugs, suitably patterned screens or stencils, or like techniques. As shown in FIG. 2C, the P-type thermoelectric paste is deposited when the locations for N-type thermoelectric elements are masked or protected. The mask or the protector is then removed. The N-type thermoelectric paste is then deposited into the locations positioned for N-type thermoelectric elements 15, while the locations for P-type thermoelectric elements 14 are masked or protected (FIG. 2D). After removal of the mask or the protector, the deposited thermoelectric pastes are cured or sintered to form P- and N-type thermoelectric elements 14 and 15. Of course, the curing/sintering step may alternatively take place after the module is completely assembled. A thermoelectric module is fabricated when the P- and N-type thermoelectric elements are connected, electrically in series and thermally in parallel.

As described herein, invention methods employ several techniques for electrically connecting thermoelectric elements in order to form thermoelectric modules. The following embodiments provide illustrative examples of three different connecting techniques: the additive technique, the laminating technique, and the combination of additive and laminating techniques.

Figure 3A:
FIGS. 3A, 3B, 3C, 3D, 3E, 3F and 3G diagram a process which illustrates an example means for electrically connecting the thermoelectric elements to form a thermoelectric module using an additive technique.
Figure 3B:
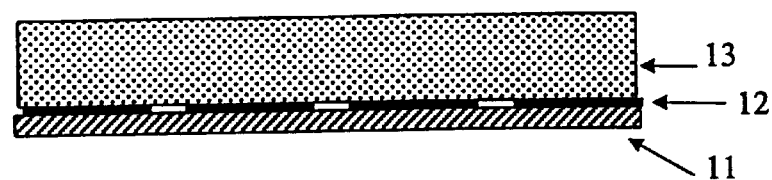
Figure 3C:
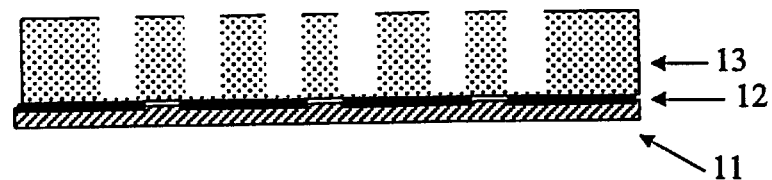
Figure 3D:
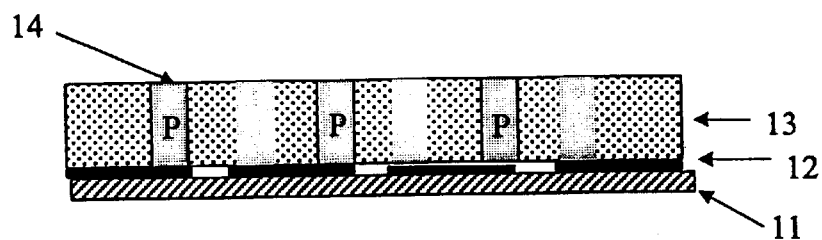
Figure 3E:
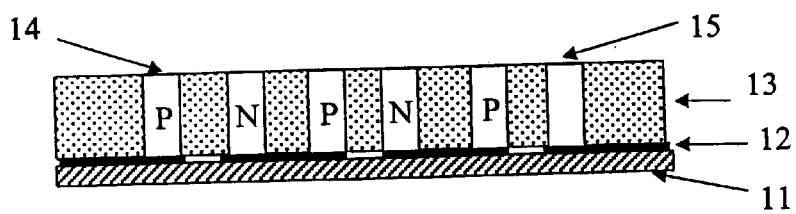

As shown in FIGS. 3A through 3G, an additive technique may be employed for electrically connecting thermoelectric elements to form a thermoelectric module. The process begins with the fabrication of a layer of conductive traces 12 on an insulating plane 11 by methods described herein, or other techniques known to those skilled in the art (FIG. 3A). A patternable insulator 13 is then affixed onto the conductive traces using suitable techniques as described herein for either liquid or dry film pastes, or other techniques known to those skilled in the art (FIG. 3B). A desired pattern is imparted to the patternable insulator layer as described herein, or using other techniques known in the art (FIG. 3C). In FIGS. 3D and 3E, P- and N-type thermoelectric elements 14 and 15 are fabricated in the patterned regions using the same methods as shown in FIGS. 2C and 2D and described herein.

Figure 3F:
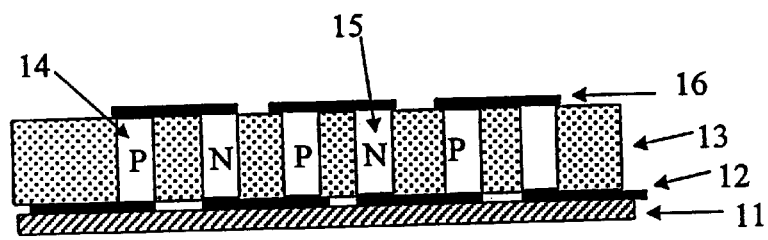
Figure 3G:
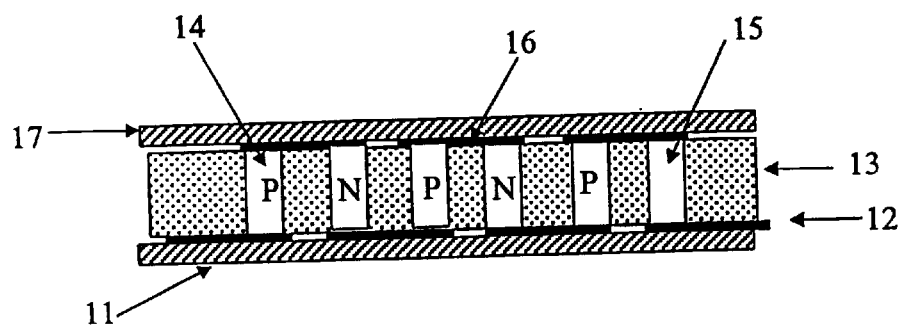
Figure 4A:
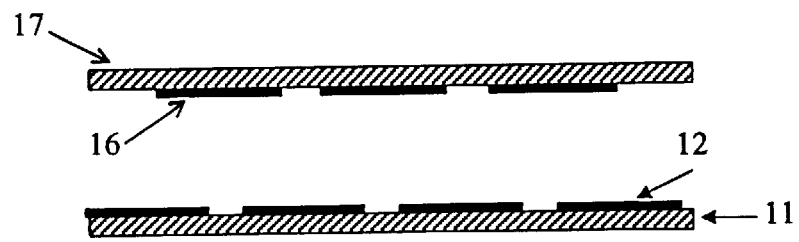
FIGS. 4A, 4B, 4C and 4D diagram a process which illustrates an example means for electrically connecting the thermoelectric elements to form a thermoelectric module using a laminating technique.
Figure 4B:
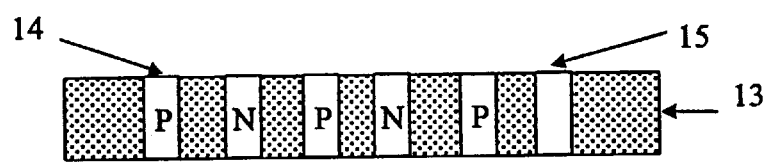
Figure 4C:
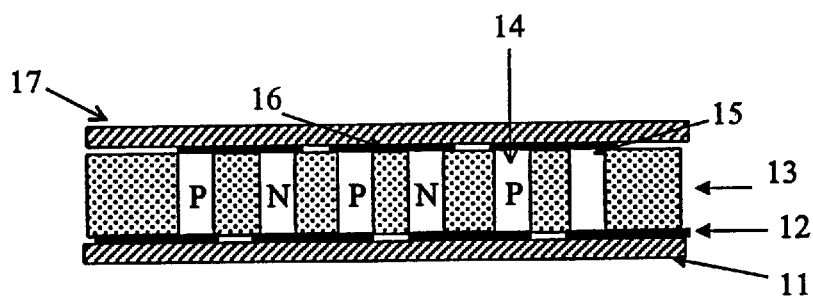
Figure 4D:
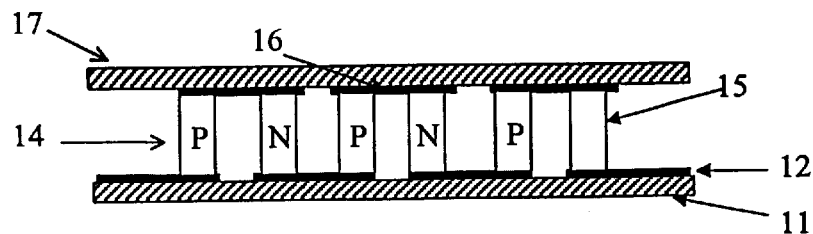

A layer of conductive traces 16 is applied to the surface of the patternable insulator layer using suitable techniques as described herein, or other techniques known to those skilled in the art (FIG. 3F). The conductive traces 16 connect the P- and N-type thermoelectric elements so that they are electrically in series and thermally in parallel. Finally, the production of the thermoelectric module is completed when an insulating plane is affixed, as shown in FIG. 3G.

As illustrated in FIGS. 4A through 4D, a laminating technique may be employed for electrically connecting thermoelectric elements to form thermoelectric modules. The process begins with fabricating a layer of conductive traces 12 and 16 on first and second insulating planes 11 and 17, respectively, as described hereinabove. (FIG. 4A) Next, a layer of P- and N-type-thermoelectric elements 14 and 15, respectively (FIG. 4B), is fabricated separately in a patternable insulator layer 13 using the same techniques shown in FIGS. 2A to 2D and described herein The layer of thermoelectric elements is then aligned with and applied to the layers of the conductive traces 12 and 16 on the first and second insulating planes, and all are laminated together by pressing under sufficient heat and/or pressure to ahere adjacent layers to one another. A thermoelectric module is formed when the resulting layered construct is heated to fully cure or sinter the thermoelectric elements thus forming good electrical contact between the thermoelectric elements and the conductive traces.

Multistage thermoelectric modules can be achieved by laminating more than one layer of thermoelectric elements with one or more intermediate trace-containing layers and heating the laminate to fully sinter/cure the thermoelectric elements and form electrical contact.

Figure 5A:
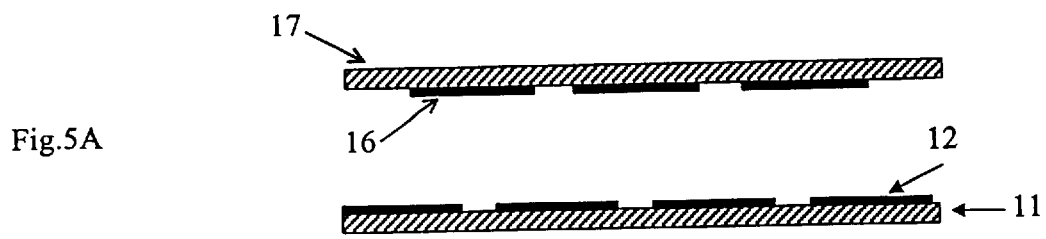
FIGS. 5A, 5B, 5C, 5D, 5E, 5F and 5G diagram a process which illustrates an example means for electrically connecting the thermoelectric elements to form a thermoelectric module using a combination of the additive and laminating techniques.
Figure 5B:
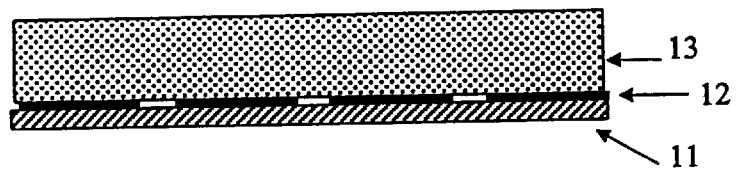
Figure 5C:
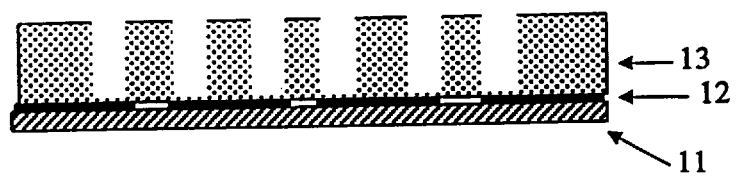

A method for electrically connecting thermoelectric elements to form thermoelectric modules using a combination of the additive and laminating techniques is illustrated in FIGS. 5A through 5G. The process begins with fabrication of a layer of conductive traces 12 and 16 on first and second insulating planes 11 and 17, respectively, as described hereinabove. (FIG. 5A) In the next step (FIG. 5B), a patternable insulator layer 13 is applied to the surface of the first conductive trace-containing layer 12 as depicted in FIG. 3 and described hereinabove. A desired pattern is then formed on the insulator layer. (FIG. 5C).

Figure 5D:
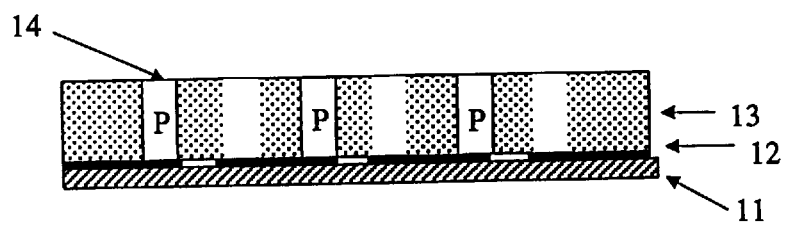
Figure 5E:
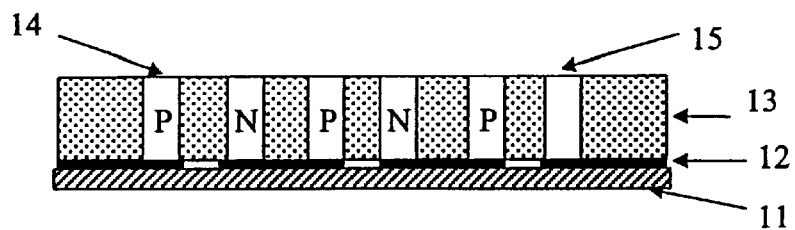

FIGS. 5D and 5E illustrate the thermoelectric pastes deposited into the patterned insulator layer in order to form a layer of thermoelectric elements. This is acheived when P-type thermoelectric paste is deposited into the pattern holes for P-type thermoelectric elements, while pattern holes for N-type thermoelectric elements are masked or protected (FIG. 5D). The mask or protector is removed after the deposition process. N-type thermoelectric paste is then deposited while the filled P-type thermoelectric elements are masked or protected (FIG. 5E). The deposition process is finished when the mask or protecting layer on top of the P-type thermoelectric elements is removed.

Figure 5F:
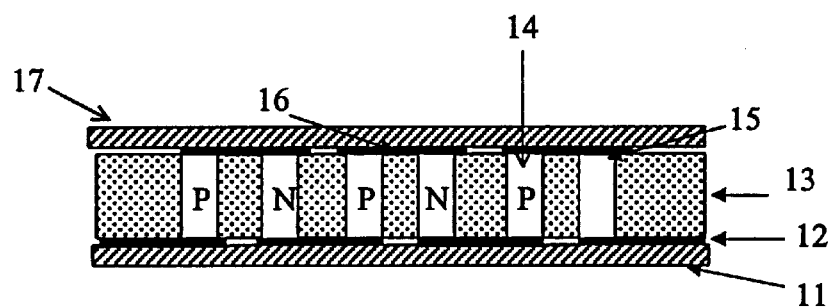
Figure 5G:
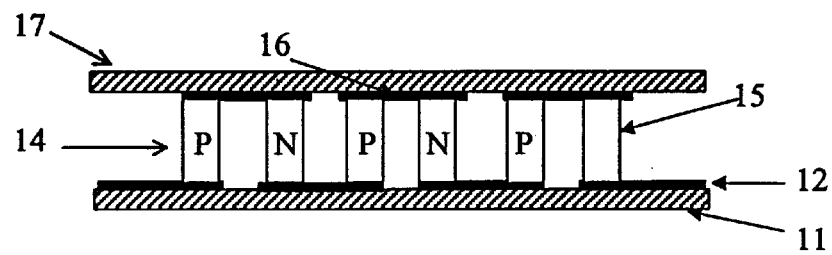

As shown in FIG. 5F, the second insulating plane 17 with conductive traces 16 is laminated onto the layer of thermoelectric elements. Pressure may be applied in order to achieve better contact between the conductive traces and the thermoelectric elements. To achieve good electrical, and mechanically strong contacts between the thermoelectric elements and the conductive traces, it is advantageous to form an electrically conductive bond between the thermoelectric elements and the conductive traces by a curing or sintering process. The thermoelectric module is thus obtained by curing/sintering the deposited thermoelectric pastes at a desired temperature to complete the formation of the thermoelectric elements (FIG. 5F). If ceramic thick film thermoelectric pastes are used, the polymer-based patternable insulating layer 13 may be burned out during the sintering process due to the comparatively high sintering temperature ($>500°$ C.). The structure of the resulting thermoelectric module is shown in the FIG. 5G.

Multistage thermoelectric modules can be fabricated in the same fashion by laminating several alternating thermoelectric layers and conductive layers on top of each other and subsequently sintering the laminate at suitable temperatures.

While the invention has been described in detail with reference to certain embodiments thereof, it will be understood that modifications and variations are within the spirit and scope of that which is described and claimed.

That which is claimed is:

1. A method for creating thermoelectric elements or precursor thereof said method comprising:
    a) selectively imparting a pattern to a patternable insulator layer, thereby forming pattern holes therethrough,
    b) selectively depositing P and N thermoelectric pastes into portions of said pattern holes,
    c) optionally, curing and/or sintering said P and N thermoelectric pastes,
   wherein said pattern holes into which said P-type thermoelectric paste is deposited are not the same as the pattern holes into which said N-type thermoelectric paste has been deposited, such that a layer of thermoelectric elements is formed containing one or more thermoelectric couples.

2. A method according to claim 1, wherein said thermoelectric paste is a polymer thick film thermoelectric paste or a ceramic thick film thermoelectric paste.

3. A method according to claim 2, wherein said ceramic thick film thermoelectric paste comprises:
    a) ceramic thermoelectric materials or precursors thereof,
    b) a suitable solvent,
    c) optionally, an organic binder, and
    d) optionally, glass frit.

4. A method according to claim 2, wherein said polymer thick film thermoelectric paste comprises:
    a) thermoelectric materials or precursors thereof,
    b) a polymer binder, and
    c) optionally, a suitable solvent.

5. A method according to claim 1, wherein said patternable insulator is selected from the group consisting of photopatternable epoxies, epoxy-acrylates, polyimide-based resins, epoxy based resins, thermoplastics, methacrylates, cyclic hydrocarbons and phenolic based resins.

6. A method according to claim 1, wherein said patternable insulator layer is patterned by photoimaging and subsequent development, plasma etching, sand blasting, laser drilling, chemical etching or mechanical drilling.

7. A method according to claim 1, wherein said patternable insulator is applied by laminating, screen printing, curtain coating, doctor blading, spraying, spin coating, roller coating, extrusion, or stencil printing.

8. A method according to claim 1, wherein said thermoelectric pastes are deposited by screen printing, pressure filling, doctor blading, automatic dispensing, or stencil printing.

9. A layer of thermoelectric elements produced by the method of claim 1, wherein said P- or N-type thermoelectric pastes comprise polymer thick paste.

10. An article of manufacture incorporating one or more thermoelectric elements according to claim 9.

11. A method for forming a thermoelectric module or precursor thereof, said method comprising:
    a) fabricating conductive traces on a first insulating plane, thereby forming a first trace-containing layer,
    b) forming on said first trace-containing layer a layer of thermoelectric elements according to the method of claim 1,
    c) optionally:
        (i) forming an intermediate trace-containing layer by applying conductive traces on first and second sides of an insulating plane,
        ii) affixing said first side of said intermediate trace-containing layer to said layer of thermoelectric elements,
        iii) affixing to said second side of said intermediate trace-containing layer a next layer of thermoelectric elements,
        iv) optionally repeating steps (i)–(iii),
    d) fabricating conductive traces on the layer of thermoelectric elements formed during step (b) or affixed during the last iteration of step (iii), if carried out, thereby forming a second layer of conductive traces,
    e) affixing a second insulating plane to said second layer of conductive traces, thereby forming a second trace-containing layer,
   wherein said thermoelectric element(s) is electrically connected to said conductive traces on said first, second and any intermediate insulating planes such that a thermoelectric module is formed.

12. A method according to claim 11, wherein said insulating planes comprise an electrically insulating material selected from the group consisting of polymers, polymer-based composites, insulated metals, metal matrix composites and ceramics.

13. A method according to claim 11, wherein said conductive traces are fabricated by etching metal laminates, vapor deposition of metals, or depositing conductive pastes.

14. An article of manufacture incorporating one or more thermoelectric modules manufactured according to the method of claim 11, wherein said P- or N-type thermoelectric pastes comprise polymer thick film paste.

15. A method for forming a thermoelectric module or precursor thereof, said method comprising:
    a) fabricating conductive traces on a first and a second insulating plane, thereby forming first and second trace-containing layers,
    b) applying a patternable insulating layer to said first trace containing layer,
    c) forming on said patternable insulating layer a layer of thermoelectric elements according to the method of claim 1,
    d) optionally,
        i) forming an intermediate trace-containing layer by applying conductive traces on first and second sides of an insulating plane,
        ii) affixing a first side of said intermediate trace-containing layer to said layer of thermoelectric elements,
        iii) forming on said patternable insulating layer a layer of thermoelectric elements according to step (c),
        iv) optionally, repeating steps i–iii
    e) laminating the second trace-containing layer to said layer of thermoelectric elements,
    f) optionally heating said laminate under conditions suitable to sinter the thermoelectric pastes, thereby forming a thermoelectric module.

16. A method for forming a thermoelectric module or precursor thereof, said method comprising;
    a) fabricating conductive traces on a first and a second insulating plane, thereby forming first and second trace-containing layers,
    b) forming a layer of thermoelectric elements according to the method of claim 1, c) optionally,
   i) forming one or more intermediate trace-containing layers by applying conductive traces on first and second sides of an insulating plane,
   ii) forming one or more layers of thermoelectric elements according to step (b),
d) laminating said layer of thermoelectric elements, and any optional trace-containing layers alternating with any optional layers of thermoelectric elements, between said first and second trace-containing layers,
e) optionally heating said laminate under conditions suitable to sinter the thermoelectric pastes, thereby forming a thermoelectric module.

17. A layer of thermoelectric elements produced by the method of claim 1, wherein said P- or N-type thermoelectric pastes comprise polymer thich film paste and wherein said thermoelectric elements have a size in the range of 10 $\mu$m to about 1 mm.

18. An article of manufacture incorporating one or more thermoelectric modules manufactured according to the method of claim 11, wherein said P- or P-type thermoelectric pastes comprise polymer thick film paste and wherein said thermoelectric modules comprise thermoelectric elements having a size in the range of 10 $\mu$m to about 1 mm.

\* \* \* \* \*

UNITED STATES PATENT AND TRADEMARK OFFICE
CERTIFICATE OF CORRECTION

PATENT NO.     : 6,127,619
DATED          : October 3, 2000
INVENTOR(S)    : Xi et al.

It is certified that error appears in the above-identified patent and that said Letters Patent is hereby corrected as shown below:

Column 9,
Line 58, after "thick" insert -- film --

Column 12,
Line 8, delete "P-type" and insert therefor -- N-type --

Signed and Sealed this

First Day of April, 2003

JAMES E. ROGAN
*Director of the United States Patent and Trademark Office*